United States Patent [19]

Miller

[11] Patent Number: 5,472,912
[45] Date of Patent: Dec. 5, 1995

[54] METHOD OF MAKING AN INTEGRATED CIRCUIT STRUCTURE BY USING A NON-CONDUCTIVE PLUG

[75] Inventor: Robert O. Miller, Carrollton, Tex.

[73] Assignee: SGS-Thomson Microelectronics, Inc., Carrollton, Tex.

[21] Appl. No.: 335,492

[22] Filed: Nov. 7, 1994

Related U.S. Application Data

[63] Continuation of Ser. No. 160,686, Nov. 30, 1993, abandoned, which is a continuation-in-part of Ser. No. 124,836, Sep. 21, 1993, Ser. No. 948,590, Sep. 22, 1992, abandoned, and Ser. No. 146,825, Nov. 1, 1993, which is a continuation of Ser. No. 835,731, Feb. 11, 1992, abandoned, which is a continuation of Ser. No. 609,883, Nov. 5, 1990, Pat. No. 5,108,951, said Ser. No. 124,836, is a continuation of Ser. No. 443,898, Nov. 30, 1989, abandoned.

[51] Int. Cl.$^6$ ............................................. H01L 21/441
[52] U.S. Cl. ........................ 437/194; 437/190; 437/192
[58] Field of Search .................................... 437/190, 192, 437/194, 195, 197, 245, 246; 148/DIG. 25, DIG. 26

[56] References Cited

U.S. PATENT DOCUMENTS

| | | | |
|---|---|---|---|
| 3,158,504 | 11/1964 | Anderson | 437/188 |
| 3,900,598 | 8/1975 | Hall et al. | 437/194 |
| 4,107,726 | 8/1978 | Schilling | 257/763 |
| 4,436,582 | 3/1984 | Saxena | 437/192 |
| 4,502,209 | 3/1985 | Eizenberg et al. | 437/190 |
| 4,566,177 | 1/1986 | van de Ven | 437/194 |
| 4,592,802 | 6/1986 | Deleonibus et al. | 437/192 |
| 4,661,228 | 4/1987 | Mintz | 204/192.25 |
| 4,756,810 | 7/1988 | Lamont et al. | 204/192.3 |
| 4,758,533 | 7/1988 | Magee et al. | 437/194 |
| 4,772,571 | 9/1988 | Scovell et al. | 437/192 |
| 4,833,519 | 5/1989 | Kawano et al. | 437/190 |
| 4,837,183 | 6/1989 | Polito et al. | 437/197 |
| 4,892,844 | 1/1990 | Cheung | 437/194 |
| 4,944,961 | 7/1990 | Lu | 427/314 |
| 4,970,176 | 11/1990 | Tracy et al. | 437/197 |
| 4,975,389 | 12/1990 | Ryan et al. | 437/197 |
| 4,976,839 | 12/1990 | Inoue | 204/192.17 |
| 4,988,423 | 1/1991 | Yamamoto | 437/194 |
| 4,994,162 | 2/1991 | Armstrong | 204/192.15 |
| 5,106,781 | 4/1992 | De Vries | 437/194 |
| 5,108,570 | 4/1992 | Wang | 204/192.3 |
| 5,108,951 | 4/1992 | Chen et al. | 437/197 |
| 5,231,055 | 7/1993 | Smith | 437/190 |
| 5,312,772 | 5/1994 | Yokoyama et al. | 437/190 |

FOREIGN PATENT DOCUMENTS

| | | |
|---|---|---|
| 0107259A3 | 5/1984 | European Pat. Off. . |
| 0132720A1 | 2/1985 | European Pat. Off. . |
| 0137701A1 | 4/1985 | European Pat. Off. . |
| 0168828A2 | 1/1986 | European Pat. Off. . |
| 0257277A2 | 3/1988 | European Pat. Off. . |
| 0269019A3 | 6/1988 | European Pat. Off. . |
| 0273715A2 | 7/1988 | European Pat. Off. . |
| 276087AA2 | 7/1988 | European Pat. Off. . |

(List continued on next page.)

OTHER PUBLICATIONS

TiN Metallization Barriers: from 1.2μ to 0.35μ Technology Fabio Pintchovski and Ed Travis, Motorola, Inc., Austin, Tex. pp. 777–786, 1992 Materials Research Society.

Development of a Planarized Al–S1 Contact Filling Technology Hisako Ono, et al., VMIC Conference, Jun. 1990, pp. 76–82.

(List continued on next page.)

*Primary Examiner*—Chandra Chaudhari
*Attorney, Agent, or Firm*—Kenneth C. Hill; Lisa K. Jorgenson; Richard K. Robinson

[57] ABSTRACT

A conductive layer is formed over an insulating layer and extending down into a contact opening. An insulating layer is then deposited over the device and in the opening, and etched back to form a plug of dielectric material in the bottom of the opening. An aluminum layer is then deposited over the device and in the opening under such conditions as to cause a substantially complete fill of the opening by the aluminum, and result in a planar surface above the opening.

15 Claims, 1 Drawing Sheet

FOREIGN PATENT DOCUMENTS

| | | |
|---|---|---|
| 0310108A2 | 4/1989 | European Pat. Off. . |
| 0329227A1 | 8/1989 | European Pat. Off. . |
| 0351001A1 | 1/1990 | European Pat. Off. . |
| 0430403A2 | 6/1991 | European Pat. Off. . |
| 0451571A2 | 10/1991 | European Pat. Off. . |
| 0488264A3 | 6/1992 | European Pat. Off. . |
| 0488628A2 | 6/1992 | European Pat. Off. . |
| 0499241A1 | 8/1992 | European Pat. Off. . |
| 54-71564 | 8/1979 | Japan . |
| 57-139939A | 8/1982 | Japan . |
| 58-46641A | 3/1983 | Japan . |
| 60-227446 | 11/1985 | Japan . |
| 61-142739A | 6/1986 | Japan . |
| 63-124447A | 5/1988 | Japan . |
| 63-136547A | 6/1988 | Japan . |
| 1-077122 | 3/1989 | Japan . |
| 1-160036A | 6/1989 | Japan . |
| 2-137230A | 5/1990 | Japan . |
| 2122566A | 7/1983 | United Kingdom . |
| 22128636A | 5/1984 | United Kingdom . |

OTHER PUBLICATIONS

Aluminum Metallization for ULSI, Dipankar Pramanik et al., Solid State Technology Mar. 1990, No. 3, Westford, Mass. pp. 73–79.

Thin–film reactions of Al with Co, Cr, Mo, Ta, Ti, and W E. G. Golgan, et al., vol. 4, No. 4, 1989 Materials Research Society, pp. 815–820.

Planarized Aluminum Deposition on TiW and TiN Layers by High Temperature Evaporation, G. E. Georgiou, et al., AT&T Bell Laboratories, Jun. 1989 VMIC Conference, pp. 315–321.

The properties of aluminum thin films sputter deposited at elevated temperatures, M. Inoue et al., J. Vac. Sci. Technol. May 6, 1988, pp. 1636–1939.

Evaluation of Titanium as a Diffusion Barrier Between Aluminum and Silicon for 1.2 µm CMOS Integrated Circuits, M. Farahani, et al., Electrochemical Society Active Member, pp. 2835–2845, Nov. 1987.

Nonconformal Al Via Filling and Planarization by Partially Ionized Beam Deposition for Multilevel Interconnection, S. N. Mei, et al., Oct. 1987 IEEE Electron Devices Letters, pp. 503–505.

Aluminum Alloy Planarization for Topography Control of Multilevel VLSI Interconnect, van Gogh, et al., Jun. 1987, V–MIC Conf., IEEE, pp. 371–375.

Interconnect Materials for VLSI Circuits, Y. Pauleau, Centre National d'Etudes des Telecommunications, Meylan, France Apr. 1987, Solid State Technology, pp. 155–162.

"Planarization of Al Alloy Film During High Rate Sputtering", V. Hoffman, et al., Intl. Conf. on Metallurgical Coatings, San Diego, Mar. 1986, Report No. 122, pp. 1–20.

"Sputtering and Interconnect Trends, Peter Burggraaf, Semiconductor International", Nov. 1984, pp. 70–73.

"TiN formed by evaporation as a diffusion barrier between Al and Si", C. Y. Ting, IBM T. J. Watson Research Center, Yorktown Heights, N.Y. 10598, May 6, 1982, J. Vac. Sci. Tech. pp. 14–18.

"High–temperature contact structures for silicon semiconductor devices", M. Wittmer, Brown Boveri Research Center, 5405 Baden–Dattwil, Switzerland, Appl. Phys. Lett., Sep. 1980 pp. 540–542.

"Silicon Processing for the VLSI Era", S. Wolf, et al., Lattice Press, Inc., 1986, pp. 332–374.

METHOD OF MAKING AN INTEGRATED CIRCUIT STRUCTURE BY USING A NON-CONDUCTIVE PLUG

CROSS REFERENCE TO RELATED APPLICATIONS

This is a continuation of application Ser. No. 08/160,686, now abandoned filed Nov. 30, 1993, which is a continuation-in-part of Ser. No. 08/124,836, filed Sep. 21, 1993, titled METHOD FOR FABRICATING INTERLEVEL CONTACTS, which is a continuation of Ser. No. 07/443,898, now abandoned, filed Nov. 30, 1989, and of Ser. No. 08/146,825, filed Nov. 1, 1993, titled METHOD FOR FORMING A METAL CONTACT, which is a continuation of Ser. No. 07/835,731, now abandoned filed Feb. 2, 1992, which is a continuation of Ser. No. 07/609,883, U.S. Pat. No. 5,108,951, filed Nov. 5, 1990, and of Ser. No. 07/948,690, now abandoned filed Sep. 22, 1992, titled METHOD FOR FORMING A METAL CONTACT.

The present application also contains subject matter in common with Ser. No. 08/159,448, filed on even date herewith, titled METHOD FOR FORMING AN ALUMINUM CONTACT, the disclosure of which is hereby expressly incorporated by reference.

All of the applications stated above are owned by the assignee of the present application, and are hereby expressly incorporated by reference.

BACKGROUND OF THE INVENTION

1. Field of the Invention

The present invention relates generally to the formation of contacts in integrated circuits, and more specifically to a method for forming interlevel aluminum contacts.

2. Description of the Prior Art

In semiconductor integrated circuits, formation of metal interconnect layers is important to the proper operation of these devices. Metal interconnect signal lines make contact to lower conductive layers of the integrated circuit through vias in an insulating layer. For best operation of the device, the metal used to form the interconnect layer should completely fill the via.

Because of its physical and electrical properties, aluminum is especially suited for fabrication of metal interconnect lines in integrated circuits. However, the sputtering process used to apply aluminum thin film layers to an integrated circuit generally results in less than ideal filling of contact vias. Large aluminum grains tend to form on the upper surface of the insulating layer. Those grains which form at the edges of the contact via tend to block it before aluminum has a chance to completely fill the via. This results in voids and uneven structures within the via.

This problem is especially acute as integrated circuit devices are fabricated using smaller geometries. The smaller contacts used in these devices tend to have a larger aspect ratio (height to width ratio) than larger geometry devices, which exacerbates the aluminum filling problem.

The uneven thickness of the aluminum layer going into the via, caused by the step coverage problem just described, has an adverse impact on device functionality. If the voids in the via are large enough, contact resistance can be significantly higher than desired. In addition, the thinner regions of the aluminum layer will be subject to the well known electromigration problem. This can cause eventual open circuits at the contacts and failure of the device.

Many approaches have been used to try to ensure good metal contact to lower interconnect levels. For example, refractory metal layers have been used in conjunction with the aluminum interconnect layer to improve conduction through a via. Sloped via sidewalls have been used to improve metal filling in the via. The use of sloped sidewalls is becoming less common as device sizes shrink because the sloped sidewalls consume too much area on a chip.

Even with these techniques, the problems of completely filling a via with aluminum are not solved. In part this is because aluminum is deposited at temperatures which tend to encourage fairly large grain sizes. Voids and other irregularities within the contact continue to be problems with current technologies.

One technique which has been proposed to overcome the via filling problem is to deposit the aluminum interconnect layers at a temperature between 500° C. and 550° C. At these temperatures, the liquidity of the aluminum is increased, allowing it to flow down into the vias and fill them. This technique is described, for example, in DEVELOPMENT OF A PLANARIZED Al—Si CONTACT FILLING TECHNOLOGY, H. Ono et al, June 1990 VMIC Conference proceedings, pages 76–82. This references teaches that temperatures below 500° C. and above 550° C. result in degraded metal filling of contact vias. It is believed that use of such a technique still suffers from problems caused by large grain sizes.

Another technique for improving metal contact step coverage is described in U.S. Pat. No. 5,108,951 issued to Chen et al, entitled METHOD FOR FORMING A METAL CONTACT. This patent describes a technique for depositing aluminum at low deposition rates within a specified temperature range. The temperature is ramped up from a temperature below approximately 350° C. while aluminum is being deposited. The teachings of this patent provide for deposition of the majority of the depth of the aluminum layer at a temperature between approximately 400°–500° C. at relatively low deposition rates.

The teachings of the Chen patent provide improved step coverage deposition for aluminum contacts. However, the described technique still suffers from random voiding, which is believed to be caused by relatively large grain sizes, or initial film nucleation which are deposited at the temperatures described.

Many other variations to the deposition of aluminum have been proposed and used in integrated circuit devices. Until now, all have suffered to some degree from less than ideal via filling. Because of the nature of the deposition process, it appears that relatively minor modifications in the technology used to form the aluminum interconnect can have important effects on the end result. What is heretofore lacking is a complete process which adequately provides for complete aluminum fill of the contact via.

As the feature sizes used to fabricate semiconductor devices continue to shrink, the problem of aluminum filling in contact openings continues to become more acute. Even approaches which provide a fairly good solution at device geometries of one micron have difficulty at 0.5 micron feature sizes. In large part, this is due to the increase in aspect ratio which occurs as openings are made smaller. The extent to which the insulating layers can be made less thick in compensation is limited, so that very small, deep contact openings are found more frequently. A method for forming contacts which addresses the aspect ratio issue can, when combined with a method which allows good fill of aluminum at more reasonable aspect ratios, provide a vastly improved technique for making interlevel contacts.

It would be desirable to provide a technique for depositing aluminum thin film layers on an integrated circuit so as to improve coverage in contact vias. Such a technique preferably provides good results with very small, high aspect ratio, interlevel contact openings. It is further desirable that such a technique be compatible with current standard process flows.

SUMMARY OF THE INVENTION

Therefore, in accordance with the present invention, a conductive layer is formed over an insulating layer and extending down into a contact opening. An insulating layer is then deposited over the device and in the opening, and etched back to form a plug of dielectric material in the bottom of the opening. An aluminum layer is then deposited over the device and in the opening under such conditions as to cause a substantially complete fill of the opening by the aluminum, and result in a planar surface above the opening.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

As is well known in the art, the term "aluminum" when referring to metal deposited as conductive interconnect for integrated circuits, typically means aluminum alloyed with small amounts of other materials, rather than pure aluminum. For example, up to a few percent of silicon and/or copper are typically alloyed with the deposited aluminum in order to improve the physical characteristics of the interconnect layer. Other alloys, using a small percentage of other materials, are well known in the art. Consistent with this usage of the term, "aluminum" as used herein is intended to apply to such typical alloys as well as pure aluminum.

Figure 1:
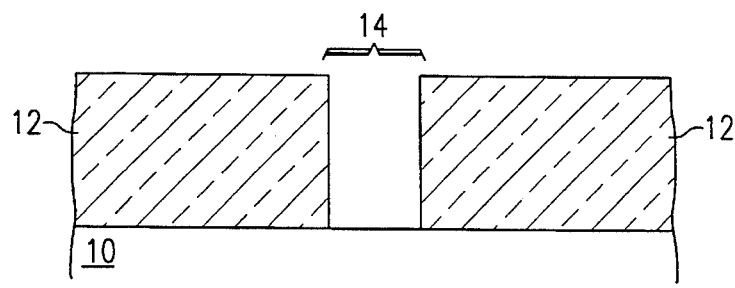
FIGS. 1–5 are cross sections of various stages of fabrication of a contact in accordance with the principles of the present invention.

Referring to FIG. 1, a contact is to be formed to a conductive substrate 10 through an insulating layer 12. As used herein, the term substrate 10 is intended to refer to any portion of a semiconductor integrated chip underlying an insulating layer 12, and is not limited to the monocrystalline silicon substrate in which transistors are formed. For example, the insulating layer 12 could overly an interconnect layer of polycrystalline silicon or metal, and as used herein the term substrate 10 is intended to encompass the formation of an interlevel contact to any of such lower layers.

An opening 14 is formed in the insulating layer 12 using an anisotropic etch as known in the art. With very small device geometries opening 14 will tend to have a relatively large aspect ratio, with the depth of the opening being high, relative to the width, in comparison with contacts made using larger geometry techniques.

Figure 2:
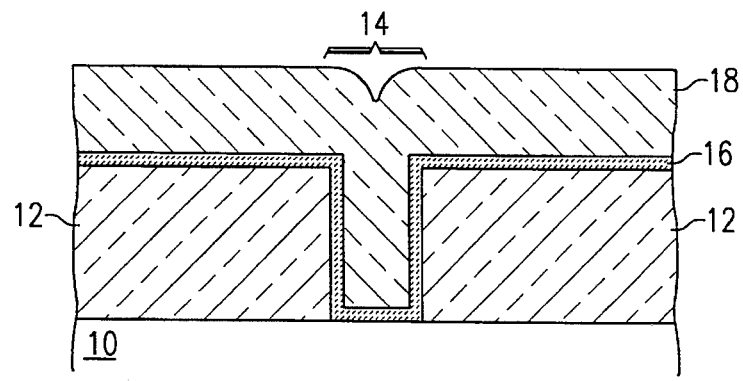

Referring to FIG. 2, a barrier layer 16 is formed over the insulating layer 12 and in the opening 14. Barrier layer 16 must also be a good conductor. Barrier layer 16 is typically a refractory metal nitride such as titanium nitride, or a titanium/titanium nitride composite, or a tungsten/titanium nitride composite, having a thickness between approximately 500 and 3000 angstroms. The barrier layer is typically formed by deposition techniques such as sputtering, but may be formed by chemical vapor deposition. Once the barrier layer 16 has been formed, it is annealed to improve its barrier properties, and to form a silicide in the bottom of the opening 14 if the underlying substrate 10 is the actual monocrystalline silicon substrate or another silicon containing layer. No such formed silicide region is shown in FIG. 2.

An insulating layer 18 is then formed over the barrier layer 16. Layer 18 can be, for example, a low temperature oxide or undoped polycrystalline silicon. Preferably, layer 18 is formed using chemical vapor deposition (CVD) techniques, so that the opening 14 is completely without voids. Because of the limited number of materials available for CVD deposition, materials such as low temperature oxide and undoped polycrystalline silicon are preferably used for this layer. In the preferred embodiment, it is more important that the opening 14 be filled by the layer 18 without voids, than that layer 18 has a good conductivity.

Figure 3:
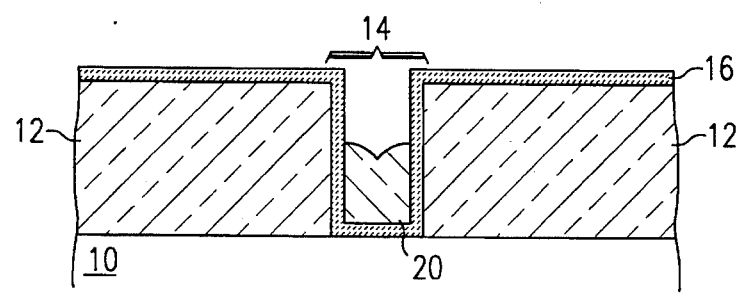

Referring to FIG. 3, layer 18 is then etched away to leave behind a poorly conductive, or non-conductive, plug 20 in the lower portion of the opening 14. This etchback may be performed using either anisotropic or isotropic techniques, and is continued for long enough to ensure that the layer 18 is removed entirely except for deep regions such as in the opening 14. The barrier 16 is conductive, and provides a conductive path from above the insulating layer 12 to the bottom of the opening 14 and the underlying substrate region 10.

Figure 4:
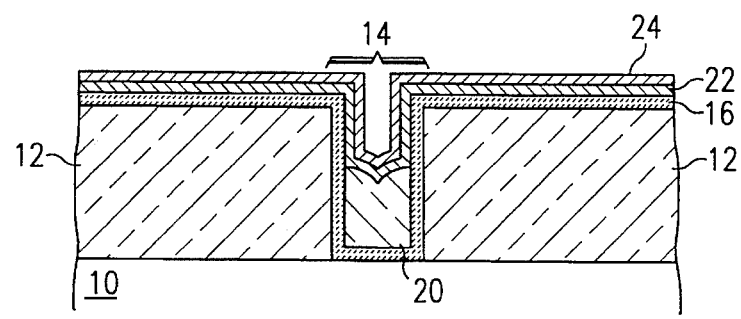
Figure 5:
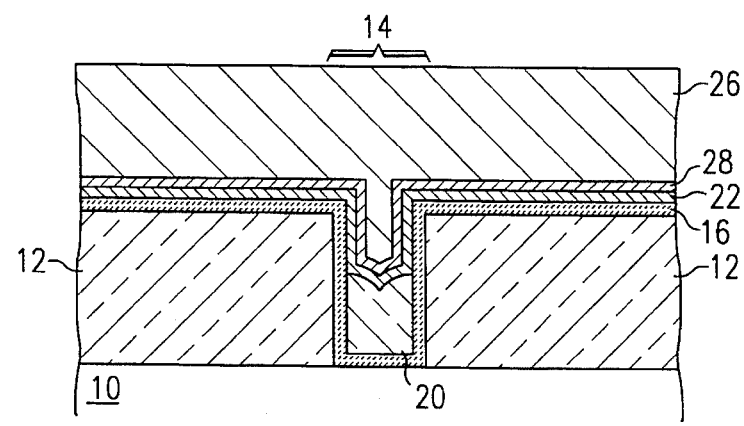

Referring to FIG. 4, a second, optional, barrier layer 22 is formed over the layer 16 and plug structure 20. This barrier layer 22 can be, for example, another titanium nitride layer formed utilizing techniques known in the art. A detailed example of a barrier layer suitable for use as layer 22 is described in co-pending patent application Ser. No. 08/159,448 titled METHOD FOR FORMING AN ALUMINUM CONTACT. In a preferred embodiment, the barrier layer can be formed by depositing a titanium nitride layer over the barrier layer 16 and the plug 20, depositing a titanium layer over the titanium nitride layer, and heating the device in a nitrogen atmosphere to convert the titanium layer to titanium nitride. If desired, a lower titanium layer can be deposited before the titanium nitride layer is deposited.

Because the metal overlying the optional barrier layer 22 will be spaced a significant distance from the bottom of the opening by the plug 20, the material selected for barrier layer 22 may be selected primarily for properties other than its function as a barrier. Thus, for example, the material used as the layer 22 may be selected primarily for its properties as an adhesion layer, or for its conductivity. It could also be selected to reduce the specularity of the overlying layer. The plug 20 allows greater flexibility in the selection of the layer 22 than might otherwise be the case.

As mentioned above, the barrier layer 22 will be optional in many cases. This is true in large part because the aluminum which will be used to complete filling of the opening 14 will be spaced a significant distance from the underlying substrate 10 by the barrier plug 20. A thin layer of titanium 24 is then deposited over the layer 22, or directly over layer 16 and plug 20 if layer 22 is omitted. Titanium layer 24 preferably has a thickness of between approximately 50 and 300 angstroms.

A layer of aluminum 26 is then deposited over the titanium layer 24, under process conditions which cause the aluminum to migrate into and completely fill the opening 14. Preferably, the aluminum is deposited at a temperature of between approximately 400° C. and 500° C., at a deposition rate of less than approximately 50 angstroms per second, preferably between approximately 30 and 50 angstroms per second. If desired a thin layer, up to several hundred angstroms thick, of aluminum may be deposited initially at a temperature less than approximately 300° C., and preferably at room temperature. After 2000 or 3000 angstroms of aluminum have been deposited at the 30 to 50 angstrom/sec rate, the deposition rate can be increased to a rate exceeding approximately 50 Å/sec. for the remainder of the layer 26. By this time, the contact opening should be substantially filled, and the planarity of the aluminum layer over the contact opening should not be adversely effected. Deposition of the aluminum at the elevated temperature just described causes it to alloy with the titanium layer 24, forming a layer of titanium/aluminum alloy 28 underneath the aluminum 26.

The process conditions under which the aluminum is deposited are described in more detail in co-pending application Ser. No. 08/159,448, METHOD FOR FORMING AN ALUMINUM CONTACT, which has been incorporated by reference herein. Even a process such as that described in the co-pending application may not provide adequate aluminum fill of an extremely deep and narrow opening 14. However, when the lower portion of the opening 14 has been filled with a plug 20, the effective aspect ratio of the opening 14 has been diminished insofar as the deposition of the aluminum layer 26 is concerned.

Thus, forming a plug in the bottom of the contact opening has several advantages. The plug separates the aluminum from the substrate, thus acting as an additional barrier to prevent spiking. As just described, the aspect ratio of the contact opening is much smaller after the plug 20 has been formed. This allows aluminum to be deposited so as to completely fill the remainder of the opening of preventing the formation of voids in the contact. The current "crowding" effect tends to confine most of the current to the periphery, or the walls, of the conductive material in a contact opening. Therefore, forming a plug from such materials as oxide or polysilicon in the contact opening does not significantly change the current flow path. The current will flow through the conductive material around the plug, taking the path of least resistance. As a result, the plug has little impact on device performance. Even though the introduction of a plug may change the electrical conductance of the interconnect structure, in submicron devices this change will be relatively insignificant.

While the invention has been particularly shown and described with reference to a preferred embodiment, it will be understood by those skilled in the art that various changes in form and detail may be made therein without departing from the spirit and scope of the invention.

What is claimed is:

1. A method for forming an interlevel contact in an integrated circuit device, comprising the steps of:

etching an opening through an insulating layer to expose a conductive structure beneath;

depositing a conductive first barrier layer over the insulating layer and in the opening, wherein the first barrier layer covers sidewalls of the opening and the conductive structure;

depositing a non-conductive conformal layer of material over the first barrier layer;

etching back the conformal layer to form a non-conductive plug filling a lower portion of the opening, wherein the non-conductive layer is removed from the first barrier layer over the insulating layer;

depositing a refractory metal layer over the first barrier layer and the plug; and depositing an aluminum layer over the refractory metal layer at a temperature and a deposition rate which allows the aluminum to migrate into the opening and completely fill the opening, wherein the aluminum layer is substantially planar over the opening.

2. The method of claim 1, further comprising the step of:

before depositing the refractory metal layer, forming a second barrier layer over the first barrier layer and the plug, wherein the refractory metal layer is formed over and in contact with the second barrier layer.

3. The method of claim 2, wherein the step of forming the second barrier layer comprises the steps of:

depositing a titanium nitride layer over the first barrier layer and the plug;

depositing a titanium layer over the titanium nitride layer; and heating the device in a nitrogen atmosphere to convert the titanium layer to titanium nitride.

4. The method of claim 3, further comprising the step of:

before depositing the titanium nitride layer, depositing a lower titanium layer over the first barrier layer and the plug, wherein the titanium nitride layer is formed over and in contact with the lower titanium layer.

5. The method of claim 1, wherein the step of depositing the non-conductive conformal layer comprises depositing the non-conductive layer by chemical vapor deposition.

6. The method of claim 5, wherein the non-conductive layer comprises polysilicon.

7. The method of claim 5, wherein the non-conductive layer comprises oxide.

8. The method of claim 1, wherein the step of etching back comprises an isotropic etch.

9. The method of claim 1, wherein the step of etching back comprises an anisotropic etch.

10. The method of claim 1, wherein the refractory metal layer comprises titanium.

11. The method of claim 10, wherein the titanium layer has a thickness of between approximately 50 Å and 600 Å.

12. The method of claim 1, wherein the aluminum is deposited at a temperature of between approximately 400° C. and 500° C., at a rate of less than approximately 50 Å/sec.

13. The method of claim 12, wherein the aluminum deposition step further comprises the step of depositing an initial layer of aluminum at a temperature less than approximately 300° C.

14. The method of claim 12, further comprising the step of depositing additional aluminum at a rate exceeding approximately 50 Å/sec.

15. The method of claim 12, wherein the aluminum deposition step comprises the step of depositing an initial layer of aluminum at approximately room temperature.

\* \* \* \* \*